United States Patent
Tortelier et al.

(10) Patent No.: US 10,716,145 B2
(45) Date of Patent: Jul. 14, 2020

(54) SYSTEM FOR TRANSMITTING DATA PACKETS ACCORDING TO A MULTIPLE ACCESS PROTOCOL

(71) Applicant: Orange, Paris (FR)

(72) Inventors: Patrick Tortelier, Clichy (FR); Muhammad moazam Azeem, Villejuif (FR); Didier Le Ruyet, Paris (FR)

(73) Assignee: ORANGE, Paris (FR)

( * ) Notice: Subject to any disclaimer, the term of this patent is extended or adjusted under 35 U.S.C. 154(b) by 0 days.

(21) Appl. No.: 15/542,290

(22) PCT Filed: Dec. 30, 2015

(86) PCT No.: PCT/FR2015/053777
§ 371 (c)(1),
(2) Date: Jul. 7, 2017

(87) PCT Pub. No.: WO2016/110631
PCT Pub. Date: Jul. 14, 2016

(65) Prior Publication Data
US 2018/0270864 A1    Sep. 20, 2018

(30) Foreign Application Priority Data

Jan. 7, 2015 (FR) ..................... 15 50110

(51) Int. Cl.
*H04W 74/08* (2009.01)
*H04L 1/00* (2006.01)
(Continued)

(52) U.S. Cl.
CPC ....... *H04W 74/0816* (2013.01); *H03M 13/03* (2013.01); *H03M 13/154* (2013.01);
(Continued)

(58) Field of Classification Search
CPC ......... H04W 74/0816; H04W 74/0825; H04W 74/006; H04W 28/04; H04W 28/18;
(Continued)

(56) References Cited

U.S. PATENT DOCUMENTS 7,228,489 B1 * 6/2007 Boyer ............... H03M 13/2936
375/262
7,721,185 B1    5/2010 Feng
(Continued)

OTHER PUBLICATIONS

Azeem, Muhammad Moazam, Erasure Correcting Codes for Opportunistic Spectrum Access (OSA), 2014, Conservatoire National des Arts et Metiers—CNAM, NNT:2014CNAM1002. (Year: 2014).*
(Continued)

*Primary Examiner* — Joshua Kading
(74) *Attorney, Agent, or Firm* — David D. Brush; Westman, Champlin & Koehler, P.A.

(57) ABSTRACT

A system for transmitting data packets includes at least one access point and at least one terminal. The access point receives data packets transmitted by the terminal in compliance with a multiple access protocol including carrier detection, and transmits to the terminal at least the width of the contention window that the terminal is to observe for transmitting a packet. The transmitted packets are coded using an erasure code and the access point is further adapted to decode the received packets. The system may be applied to networks such as WLANs.

11 Claims, 4 Drawing Sheets

(51) Int. Cl.
  *H03M 13/37* (2006.01)
  *H03M 13/03* (2006.01)
  *H04L 12/413* (2006.01)
  *H04W 28/04* (2009.01)
  *H03M 13/15* (2006.01)
  *H04W 28/18* (2009.01)
  *H04W 74/00* (2009.01)
  *H04W 88/08* (2009.01)
  *H04W 84/12* (2009.01)

(52) U.S. Cl.
  CPC .......... *H03M 13/373* (2013.01); *H04L 1/004* (2013.01); *H04L 1/0009* (2013.01); *H04L 1/0014* (2013.01); *H04L 1/0022* (2013.01); *H04L 1/0075* (2013.01); *H04L 12/413* (2013.01); *H04W 28/04* (2013.01); *H04W 28/18* (2013.01); *H04W 74/006* (2013.01); *H04W 74/0825* (2013.01); *H04W 88/08* (2013.01); *H03M 13/1515* (2013.01); *H04W 84/12* (2013.01)

(58) Field of Classification Search
  CPC ... H04W 88/08; H04W 84/12; H03M 13/373; H03M 13/154; H03M 13/03; H03M 13/1515; H03M 13/293; H03M 13/455; H03M 13/2942; H03M 13/617; H03M 1/0675; H03M 1/0687; H04L 12/413; H04L 1/0075; H04L 1/0014; H04L 1/0009; H04L 1/004; H04L 1/0022; H04L 1/1832; H04L 1/187; H04L 1/0063; H04L 1/0618; H04L 1/0637; H04L 47/10; H04L 47/27
  See application file for complete search history.

(56) References Cited

U.S. PATENT DOCUMENTS

| | | | |
|---|---|---|---|
| 2004/0160943 A1 | 8/2004 | Cain | |
| 2007/0223434 A1 | 9/2007 | Bennett | |
| 2008/0014979 A1* | 1/2008 | Gorokhov | H04W 52/146 455/522 |
| 2010/0103913 A1 | 4/2010 | Sung et al. | |
| 2014/0071956 A1* | 3/2014 | Park | H04W 72/0406 370/336 |
| 2015/0049751 A1* | 2/2015 | Liew | H04L 1/0048 370/338 |
| 2015/0146607 A1* | 5/2015 | Abraham | H04L 1/1685 370/312 |
| 2017/0339588 A1* | 11/2017 | Moon | H04W 88/02 |

OTHER PUBLICATIONS

Tortelier, Patrick et al., Erasure Correction-Based CSMA/CA, 2017, Institut Mines-Telecom and Springer-Verlag France SAS. (Year: 2017).*
European Office Action dated Aug. 16, 2019 for corresponding EP Application No. 15830823.9 (English translation). (Year: 2019).*
International Search Report dated Mar. 31, 2016 for corresponding International Application No. PCT/FR2015/053777, filed Dec. 30, 2015.
English translation of the Written Opinion of the International Searching Authority dated Apr. 7, 2016 for corresponding International Application No. PCT/FR2015/053777, filed Dec. 30, 2015.
G. Liva, E. Paolini, and M. Chiani, "High-throughput random access via codes on graphs" (FUNEMS 2010).
Anas Basalamah et al., "A Comparison of Packet-Level and Byte-Level Reliable FEC Multicast Protocols for WLANs", IEEE Globcom 2007.
European Office Action dated Aug. 16, 2019 for corresponding EP Application No. 15830823.9.

* cited by examiner

SYSTEM FOR TRANSMITTING DATA PACKETS ACCORDING TO A MULTIPLE ACCESS PROTOCOL

CROSS-REFERENCE TO RELATED APPLICATIONS

This Application is a Section 371 National Stage Application of International Application No. PCT/FR2015/053777, filed Dec. 30, 2015, the content of which is incorporated herein by reference in its entirety, and published as WO2016/110631 on Jul. 14, 2016, not in English.

FIELD OF THE DISCLOSURE

The present invention relates to a plurality of users transmitting digital data packets while sharing a transmission channel.

More particularly, the invention relates to transmitting data packets in the absence of a central entity coordinating the transmission instants of the users, such as for example a central entity governing multiple access by time division (time division multiple access (TDMA)).

BACKGROUND OF THE DISCLOSURE

Known protocols for accessing a channel in the absence of a central entity (which are referred to more simply in the context of the present document as "multiple access protocols") may be classified into two categories, depending on the degree of coordination between users.

In the first category of protocols, no coordination is set up between users; in particular users do not listen to the channel prior to transmitting in order to verify that the channel is free. It is attempted to avoid collision between the packets transmitted by different users by providing for each user to transmit packets at instants that are random.

A major drawback of such protocols is the inevitable existence of collisions between the packets transmitted by the different users, and thus inevitable loss of data, since there necessarily exists a non-zero probability of a packet being transmitted by one user before the end of the transmission of a packet by another user.

One solution to that drawback is proposed in the article by G. Liva, E. Paolini, and M. Chiani entitled "High-throughput random access via codes on graphs" (FUNEMS 2010). In a protocol belonging to said first category, it consists in introducing coding for correcting erasures so as to make it possible to recover the data lost in collisions. According to that article, each user transmits one or more replicas of each packet, such that when one of the replicas is received without collision, it is possible to subtract it from the analysis of collisions in which it is involved. A major drawback of that solution is that it operates at a level of the signal output by the demodulator (and thus on analog values), with all of the problems associated with imperfect estimation of channel gains (otherwise errors propagate during the iterations of the erasure correction method) and due to the presence of noise. Furthermore, the method described it that article is performed on geostationary satellite links, that can be modeled as a Gaussian channel characterized by gain and phase shift that are constant for the duration of a packet. That solution is difficult to envisage for multiple path channels of the kind observed with WiFi, i.e. for the 802.11 standard of the Institute of Electrical and Electronics Engineers (IEEE).

In the second category of protocols, each user listens to the channel, and transmits packets when no transmission is detected. A representative example of this second category is given by the distributed coordination function (DCF) of the media access control (MAC) layer in WiFi, which implements a protocol referred to as carrier sense multiple access/collision avoidance (CSMA/CA). In CSMA/CA, a first user seeking to transmit packets listens to the channel in order to determine whether or not another user is already sending packets; if so, the first user continues to listen to the channel; when the first user observes that the channel is free for a time interval that is constant and identical for all of the users, the user waits a little longer during a "backoff duration" prior to transiting a packet, said backoff duration having a value that is selected randomly in a time interval referred to as a "contention window".

A first drawback of protocols in this second category is that collisions continue to occur therein, mainly for two reasons:

- for each new backoff duration, the contention window is decremented; when it becomes zero, the terminal transmits its data without waiting, and thus with significant risk of collision, since it is not taking account of the real activity in the channel;
- there exists a "hidden node" problem in which two terminals that cannot hear each other since they are too far apart transmit simultaneously over the same channel; nevertheless, in order to mitigate this "hidden node" problem, it is possible to use a mechanism known as request to send/clear to send (RTS/CTS) in which an access point transmits authorization to transmit to one of the terminals that has sent it an RTS, and the CTS sent by the access point is received by the other terminals that lie within the coverage of the access point, so that those other terminals put off their own transmissions until later.

A second drawback of protocols in the second category is that listening to the channel prior to transmitting packets succeeds in reducing the number of collisions to which a user is subjected only at the cost of a non-negligible reduction in the time spent transmitting: specifically, users spend a great deal of time waiting to be sure that the channel is free. As a result, the aggregated throughput of data of such a system, which is equivalent to its spectral efficiency is generally sub-optimal.

SUMMARY

In a first aspect, the present invention thus provides various devices.

The invention thus provides, firstly, an access point comprising means for receiving data packets transmitted by at least one terminal in compliance with a multiple access protocol including carrier detection, and means for transmitting to said terminal at least the width of the contention window that said terminal is to observe for transmitting a packet. Said access point is remarkable in that said transmitted packets are coded using an erasure code and said access point further comprises means for decoding the received packets.

Thus, the present invention proposes applying an erasure code to the packets transmitted by the various users seeking to transmit data in the context of a CSMA/CA protocol in order to recover the packets that are deleted as a result of collision between a plurality of users. Specifically, the authors of the present invention have understood (and verified, as described in detail below) that it is possible in this way to reduce the number of packets that are lost compared with transmission without coding, and that this applies in spite of the fact that the intrinsic redundancy of any channel coding method leads to an increase in the number of packets that are transmitted, which, a priori, ought to increase the number of collisions to which each user is subjected.

It should be observed that for the reasons explained below, the code used is preferably a maximum distance separable (MDS) code.

According to particular characteristics, said access point further possesses means for transmitting to said terminal at least one parameter of said erasure code.

By means of these provisions, the access point informs the terminal which erasure code the terminal is to apply to the packets it transmits, supposing that said parameter has not been agreed to in advance (e.g. on the basis of a standard).

According to other particular characteristics, said width of the contention window is a function at least of the minimum distance of said erasure code and of the total number of terminals connected to said access point.

Specifically, the authors of the present invention have understood that, in the context of the invention, they are confronted with the following contradictory phenomena.

If the number of users increases, then the aggregated throughput tends to increase, but the number of collisions also increases and runs the risk of exceeding the correction capacity of the code; it is therefore necessary, by way of compensation, to enlarge the contention window so as to reduced the probability that two users draw the same random value for the backoff duration.

Conversely, if the number of users decreases, the number of collisions tends to decrease, thereby making it possible to narrow the contention window in order to increase the aggregated throughput of data; however increasing the number of packets that are transmitted leads to an increase in the probability of collisions, and once more it is necessary to take care to avoid exceeding the correction capacity of the code.

The authors of the present invention have understood (and verified, as described in detail below) that it is possible, for any given erasure code, to optimize the width of the contention window and the dimension of the code as a function of the number of users.

By means of these provisions, it is possible advantageously to maximize the aggregated throughput of data (or spectral efficiency) in the transmission system under consideration.

Secondly, the invention also provides a terminal comprising means for transmitting data packets to an access point in compliance with a multiple access protocol with carrier detection, together with means for receiving from said access point at least the width of the contention window that the terminal is to observe for transmitting a packet and for taking account thereof. Said terminal is remarkable in that said transmitted packets are coded by means of an erasure code.

According to particular characteristics, said terminal further comprises means for receiving from said access point at least one parameter of said error correcting code, and for taking account thereof.

The advantages made available by the terminal are essentially the same as those made available by the access point described briefly above.

In a second aspect, the invention provides a data packet transmission system. Said system is remarkable in that it comprises at least one access point as described briefly above and at least one terminal as described briefly above.

The advantages made available by the system are essentially the same as those made available by the devices described briefly above.

It should be observed that it is possible to make such devices in the context of software instructions and/or in the context of electronic circuits.

The invention also provides a computer program downloadable from a communications network and/or stored on a computer readable medium and/or executable by a microprocessor. The computer program is remarkable in that it comprises instructions for managing the operation of a terminal as described briefly above or of an access point as described briefly above, when the program is executed on a computer.

The advantages made available by the computer program are essentially the same as those made available by the devices described briefly above.

BRIEF DESCRIPTION OF THE DRAWINGS

Other aspects and advantages of the invention appear on reading the following detailed description of particular embodiments, given as non-limiting examples. The description refers to the accompanying figures, in which.

DETAILED DESCRIPTION OF ILLUSTRATIVE EMBODIMENTS

Consideration is given to a set of user terminals suitable for transmitting data packets to a certain access point using a multiple access protocol, such as the CSMA/CA protocol described briefly above. By way of example, these terminals and the access point may form part of a wireless local area network (WLAN), e.g. of the WiFi type.

Figure 1:
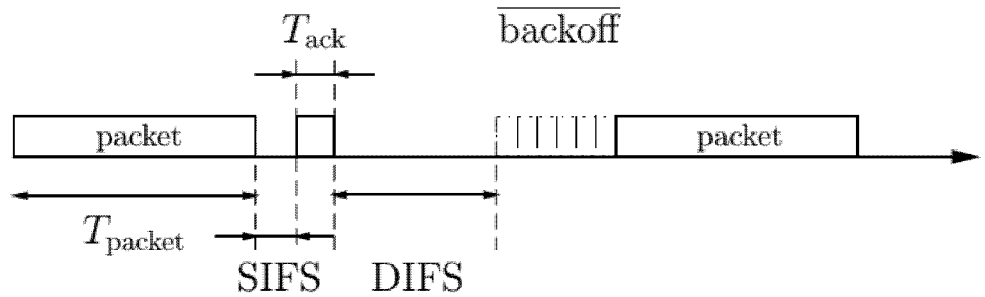
FIG. 1 is a diagram of the durations conventionally involved in the CSMA/CA protocol.

With reference to FIG. 1, the description begins with a few reminders about the durations that are conventionally involved in the CSMA/CA protocol.

In FIG. 1:

$T_{packet}$ is the transmission duration of a packet;

SIFS (stands for short interframe space) is a time interval before a transmission is followed by an acknowledgment (by default, the SIFS is 10 microseconds (μs);

$T_{ack}$ is the duration of an acknowledgment (by default, $T_{ack}$ is 2 μs): if a user has not received an acknowledgment after a time interval (SIFS+$T_{ack}$) after transmitting a packet, the packet is considered as lost;

DIFS (stands for distributed interframe space) is the above-mentioned (fixed) time interval before which a user seeing that the channel is unoccupied can start the above-mentioned backoff duration (by default DIFS is 50 µs); and the backoff duration: in order to avoid all users starting to transmit at the end of the DIFS, this random duration is added that is an integral multiple of a duration increment $T_{slot}$ (20 µs by default); as mentioned above, the backoff duration is determined randomly by each user within the contention window, written W below, and it is expressed as a number of time "slots".

In the invention, the packets transmitted by users are coded by means of one (or more) erasure codes that are themselves known. The code to be used is determined by the access point as a function of the number of users communicating therewith.

In an embodiment, the access point transmits to each user, at least after the terminal has connected with the access point, the dimension k of the code, together with the width W of the contention window to be compiled with by the user, or merely the width W of the contention window when all of the users are using the same code (e.g. a code having parameters that are standardized).

There follow a few reminders about packet coding.

Figure 2:
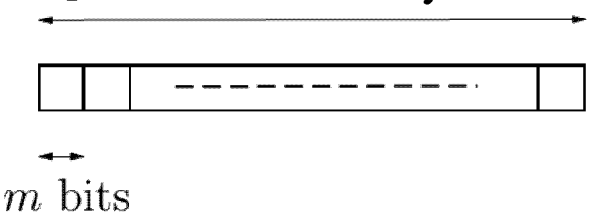
FIG. 2 shows the format of data packets in an implementation of the invention.
Figure 3:
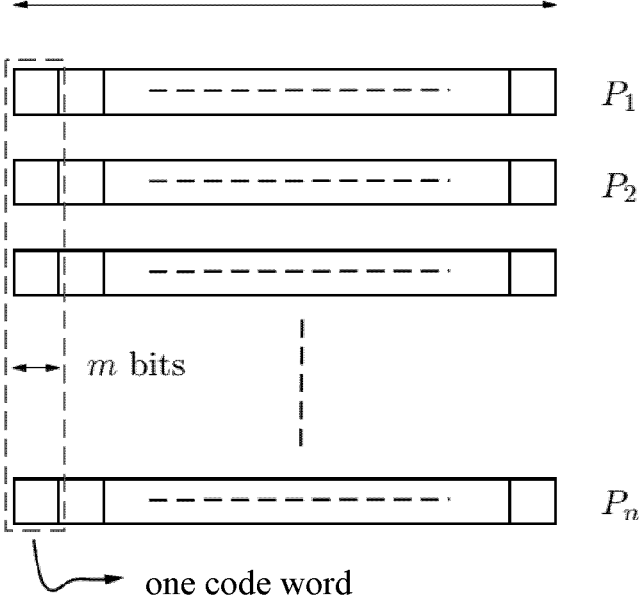
FIG. 3 shows code words being constructed from a set of data packets, in an implementation of the invention.

It is assumed that all of the packets transmitted at the same size and contain L symbols of m bits each, as shown in FIG. 2. In an implementation, the coding operation is performed transversely on a number n of successive packets $\{P_1, P_2, \ldots, P_n\}$, so that each of the L columns containing n symbols of m bits each forms a code word of length n and of dimension k, as shown in FIG. 3.

For m=1, a binary code . . . is used capable of providing erasure corrections; for this purpose, it suffices to consider the parity control matrix of the code, since each parity equation of the code, which is of the form:

$$h_1 x_1 + h_2 x_2 + \ldots + h_n x_n = 0 \quad (1)$$

where $h_i \in \{0,1\}$ and $x_i \in \{0,1\}$ for i=1, . . . , n also applies to the packets:

$$h_1 P_1 + h_2 P_2 + \ldots + h_n P_n = 0 \quad (2)$$

where 0 is the packet in which all of the bits are zero, and addition is the XOR function applied bit by bit to the packet.

For m>1, it is preferable to use a code defined on an extension field $GF(2^m)$, e.g. $GF(2^7)$ or $GF(2^8)$ depending on whether m=7 or m=8. Under such circumstances, the parity equation (2) involves arithmetic in this extension field, in particular multiplication. The codes are then Reed-Solomon (RS) codes. The decoding of each code word on a column can be performed either on the basis of these parity equations, or by using any other decoding algorithm that is used for RS codes (e.g. algebraic decoding).

The parameters to be taken into account for choosing the code are the following in particular.

The important parameter of a linear code, whether or not it is binary, is the minimum number of symbols by which two different code words differ; this quantity is written d and referred to as the "minimum distance" of the code. The parameters n, k, and d are not independent, but are constrained by a certain number of inequalities, including the Singleton bound:

$$d \leq n - k + 1 \quad (3)$$

When the inequality is reached (d=n-k+1), it is said that the code is maximum distance separable (MDS). In the binary configuration, it is found that the only MDS codes are trivial codes: a repeated code (a packet is repeated (n-1) times), or a parity code in which only one parity packet is added after (n-1) independent data packets). In order to have codes that are not trivial and that provide better performance, it is necessary to work in the above-mentioned finite fields; in this context, a conventional example of an MDS code is specifically that of the above-mentioned RS codes. The invention is thus preferably performed using an MDS code over $GF(2^m)$ with m>1.

In order to evaluate performance, it is assumed that all of the erasure configurations up to (d-1) erasures are corrected, and that all configurations of d erasures or more are not corrected (which is pessimistic, since some such configurations are corrected, but this phenomenon is ignored below). It is therefore advantageous to have the minimum distance d as great as possible for given values of n and k, which shows the importance of MDS codes in this perspective.

An implementation of the invention is described below.

In this implementation, a Reed-Solomon code is used, and for reasons of ease of implementation, it is preferable to select codes on $GF(2^8)$; the codes may be shortened, i.e. they may be of a length n<255 bytes.

Also preferably, a code rate k/n is selected that is adapted to the channel as seen by the terminals. Specifically, it would be sub-optimal to use a fixed code rate, since under most circumstances such a code would be either too powerful, or else not powerful enough; if the code rate is too small, then redundancy is introduced pointlessly and the available data rate is poorly used; conversely, if the code rate is high, the code is inefficient and is not capable of correcting all of the erasures.

In order to reduce the rate of packet loss, it is necessary to increase the width W of the contention window: the (backoff) durations of each user can then take greater values (thus giving a longer time interval between two packet transmissions). There are few collisions since the number of users is small, since there is low probability that two or more will draw the same value for the backoff duration, the correcting code has poor efficiency, and the drop in aggregated throughput is due mainly to the code rate of the correcting code. As the number of users increases, the number of collisions to which each user is subjected also increases, however if the overall correction capacity of the code is not exceeded, the aggregated throughout will continue to increase. Thereafter, at a certain point, the number of collisions begins to exceed the correction capacity; the coding can then no longer recover deleted packets, and the aggregated throughput decreases.

In a slightly simplified version of the CSMA/CA protocol, this qualitative analysis can be made more precise by the following qualitative analysis. For this purpose, it is assumed that the users always have a packet for transmission, such that in each contention period, all of the users attempt to access the resource; the aggregated throughput can thus reach its theoretical maximum (under saturated or "full-buffer" conditions).

The probability of a given user i being subjected to a collision during a contention period is given by:

$$p_{coll} = \frac{1}{W} \quad (4)$$

It can be shown that the probability of a given user i among N accesses the channel because that user drew the smallest backoff duration (but without any guarantee of being the only user to draw it, so there is still some possibility of collision), is given by:

$$p_{access} = \sum_{k=0}^{W-1} \frac{1}{W}\left(1 - \frac{k}{W}\right)^{N-1} \qquad (5)$$

It can be deduced therefrom that the probability of erasure is given by:

$$p = \frac{1}{\sum_{k=0}^{W-1}\left(1 - \frac{k}{W}\right)^{N-1}} \qquad (6)$$

In the absence of coding, the aggregated throughput for N users is thus given by:

$$D_{NC} = N \times p_{win}/\tau \qquad (7)$$

where $\tau$ is the mean time interval between two transmissions, and where:

$$p_{win} = p_{access} - \frac{1}{W} \qquad (8)$$

is the probability of a transmission being successful for any one of the N users.

In the presence of a code of length n, of dimension k and of minimum distance d, the maximum correction capacity of the code is (d−1) deleted packets. The probability of there being at most (d−1) erasures over n packets is given by:

$$p_{OK} = \sum_{k=0}^{d-1} C_n^k p^k (1-p)^{n-k} \qquad (9)$$

which is the probability of successfully decoding a code word of n packets, including k packets of information. The aggregated throughput in the presence of coding is thus given by:

$$D_C = N \times \frac{k}{n} \times p_{acc} \times p_{OK}/\tau \qquad (10)$$

These results are illustrated below by means of a few numerical values. FIGS. 4 to 7 apply to a number of users N lying in the range 1 to 40, and they show:
  the mean aggregated throughput (expressed in packets per second (packets/s)) in the absence (smooth curve) and in the presence (curves with bold dots) of correcting coding; and
  the rate at which packets are deleted in the absence of coding (smooth curve) and the rate of non-correction after decoding (curve with bold dots), per user.

Figure 4:
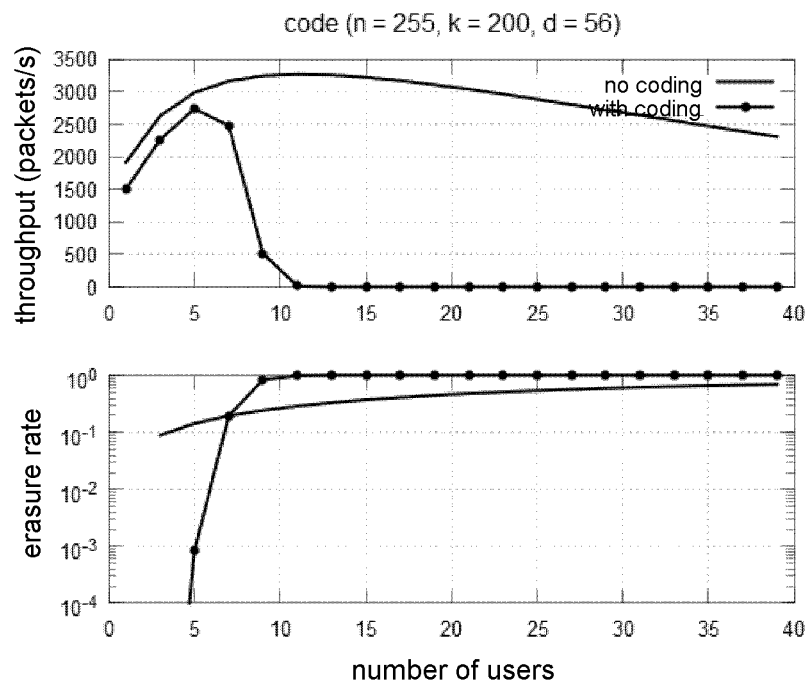
FIGS. 4 to 7 show as a function of the number of users the mean aggregated throughput in the absence of coding and in the presence of coding, and the rate of deleted packets and of non-correction after decoding by a user, for various codes and for different widths of the contention window.

In a first example, shown in FIG. 4, consideration is given to the code (n=255, k=200, d=56), and it is assumed that W=32 slots. In this figure, it can be seen that for n<6, the failure rate for correcting erasures is less than 1%; a loss of throughput is observed only as a result of the 200/255 rate of the code. Once N≥7, the correction capacity of the code is exceeded, decoding fails more often, and the failure rate becomes greater than the erasure rate in the absence of coding.

Figure 5:
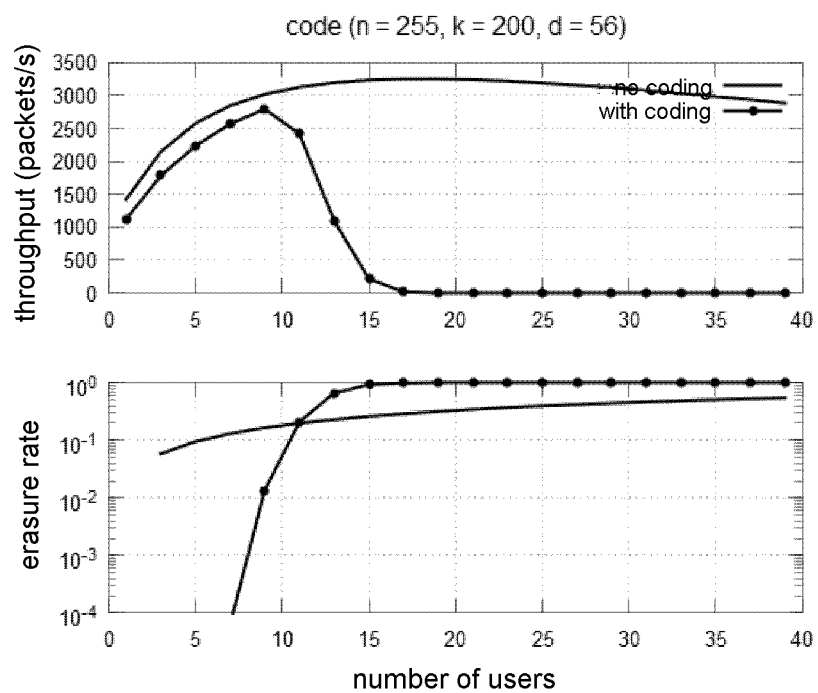

In a second example, shown in FIG. 5, the same code is used, but with W=50 slots. It is now possible to ensure a failure rate of less than 1% for up to nine users.

Figure 6:
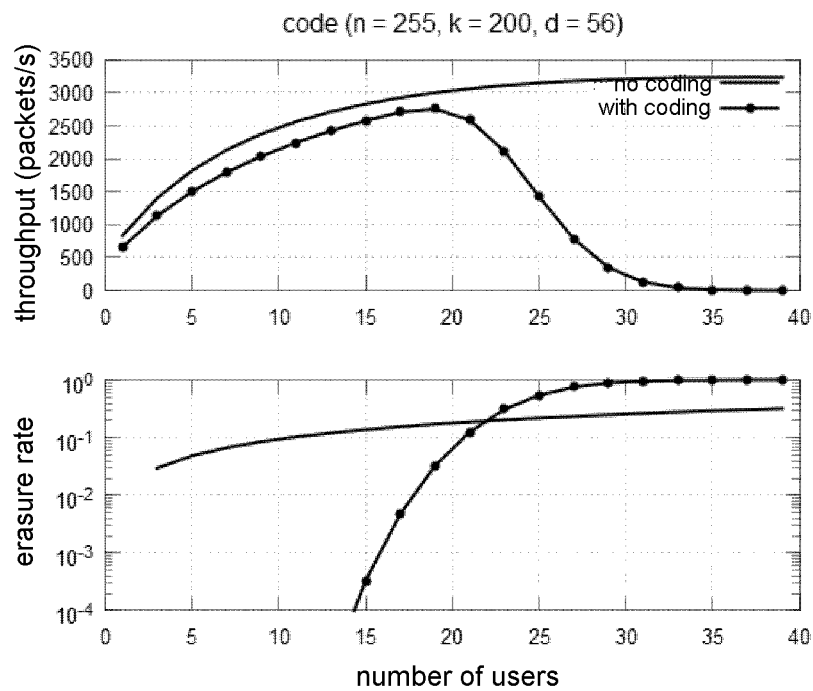

In a third example, shown in FIG. 6, the same code is used again, but with W=100 slots. This time, it is possible to accept 17 users with a failure rate of 1% after decoding. For a small number of users (fewer than five), the channel is poorly used since the contention window is too large and the collision rate in the channel is less than a few %. On increasing the number of users, the utilization of the channel is improved, and the additional collisions are remedied by means of the correcting code. Towards 20 users, the correction capacity of the code is exceeded, and the aggregated throughput collapses.

Figure 7:
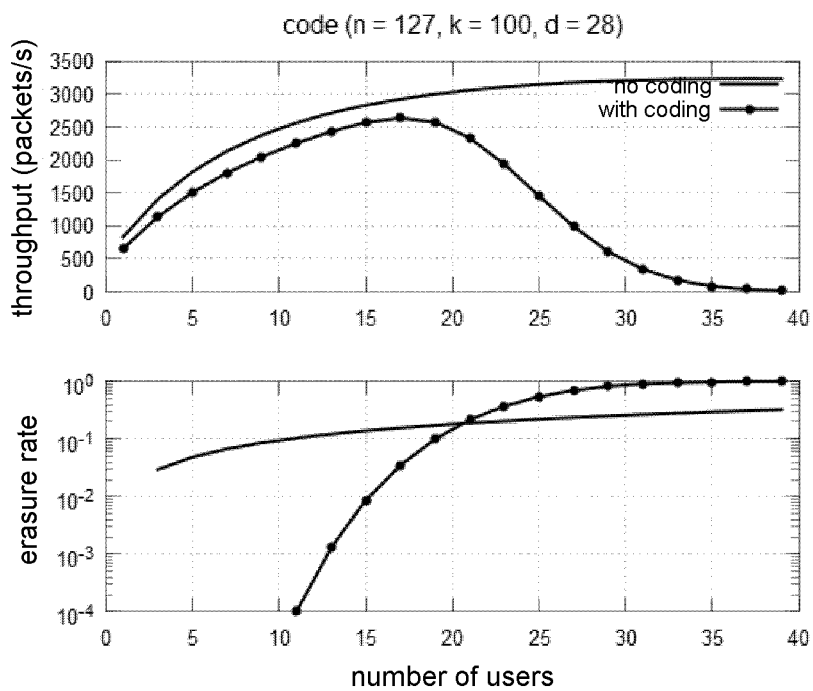

In a fourth example, shown in FIG. 7, the same contention window W=100 slots is used as in the preceding example, but the code now has the following parameters (n=127, k=100, d=28). A very slight degradation in performance is observed since the code is shorter. The maximum aggregated throughput is reached with about 17 users.

The above results suggest that it is possible to give an optimum value to the width W of the contention window if, conversely, it is assumed that the number of users competing for access to a given channel is known. Specifically, the existence of an optimum width W for the contention window is the result of a compromise: when the window is too small, there are too many collisions compared with the correction capacity of the code, erasures cannot be recovered and the throughput is zero. When W increases, there are fewer collisions, and decoding becomes effective. Thereafter, when W continues to increase, a stage is reached in which there are indeed hardly any collisions, but where the time delay between two packet transmissions becomes too long (the users space out their transmissions too much) and the aggregated throughput decreases.

It is possible to optimize the aggregated throughput by acting simultaneously on the values of k and W when calculating the function $D_c(k,W)$ of equation (10) for a fixed number N of users. To do this, a table D is constructed in which each element (i,j) is equal to the aggregated throughput $D_c$ when:
  k=i, with 1≤i≤n; and
  W=j, with 1≤j≤$W_{max}$
(where $W_{max}$ is a maximum width for the contention window, arbitrarily fixed in this example at 200 slots), and a search is made for the pair (i*, j*), corresponding to the maximum for D(i,j).

Figure 8:
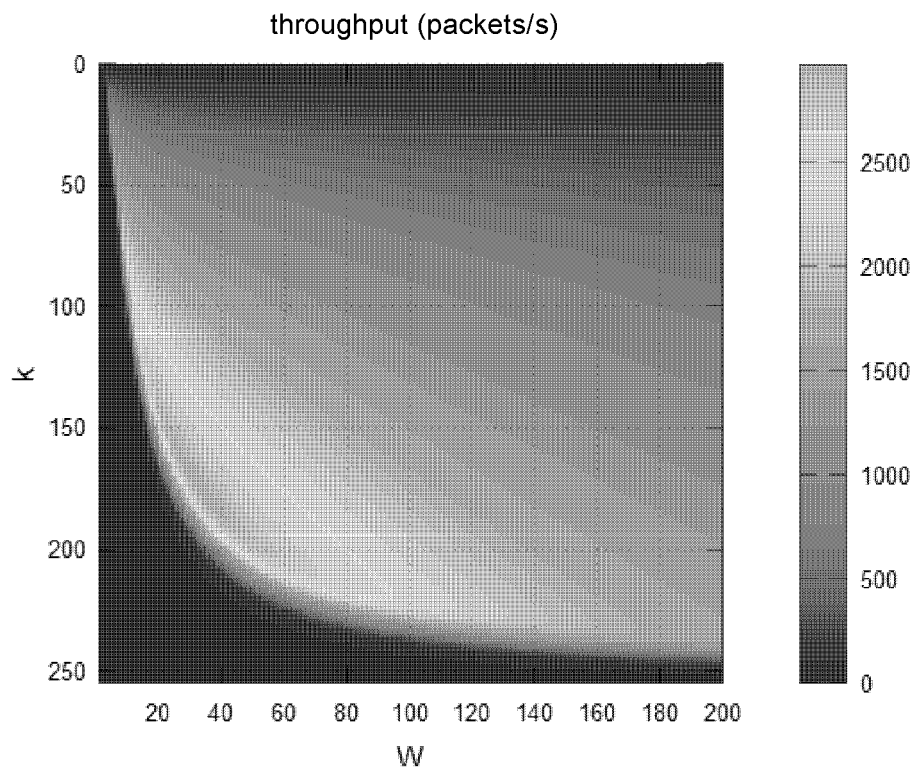
FIG. 8 applies to a code of length 255 and a number of users equal to ten, and shows the aggregated throughput as a function of the width of the contention window and the dimension of the code.

FIG. 8 is a graph representing D(k,W), for N=10 users and a code of length n=255.

Figure 9:
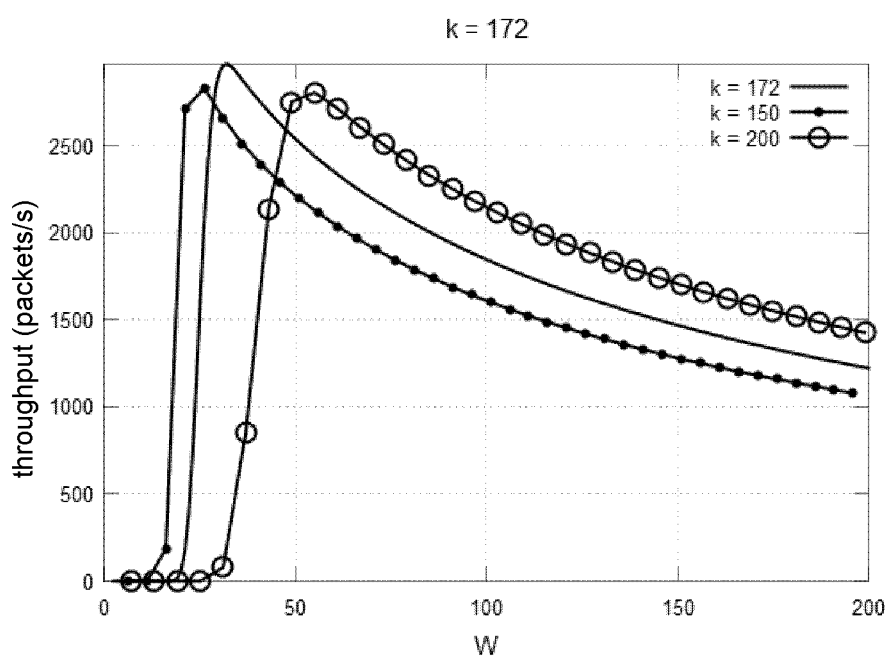
FIG. 9 applies to a code of length 255 and a number of users equal to ten, and shows the aggregated throughput as a function of the width of the contention window, for three values for the dimension of the code.

FIG. 9 applies to N=10 users and of length n=255, and shows the aggregated throughput as a function of the width of the contention window for three values for the dimension k of the code. In other words, FIG. 9 corresponds to three plane sections of FIG. 8, for three values of the parameter k: the optimum value (k=172) and the values k=150 and k=200.

It can be seen that the maximum throughput, equal to 2967 packets per second, is reached for k=172 with a window of width W=32 slots. This throughput is greater than the value given in FIG. 9 for the other two values of k (150 or 200), values for which the maximum is also reached for different values of the parameter W, while being less than said maximum that is reached when k=172 and W=32 slots. It is thus advantageous to perform optimization simultaneously on both parameters k and W.

Finally, it should be observed that the invention can be performed within nodes of a telecommunications network, e.g. transmitter terminals or access points of a WLAN, by using software and/or hardware components.

The software components may be incorporated in a conventional computer program for managing a network node. That is why, as mentioned above, the present invention also provides a computer system. The computer system comprises in conventional manner a central processor unit using signals to control a memory together with an input unit and an output unit. Furthermore, the computer system can be used to execute a computer program comprising instructions for managing the operation of terminal or of an access point of the invention.

Specifically, the invention also provides a computer program downloadable from a communications network and comprising instructions for managing the operation of a terminal or of an access point of the invention when the program is executed on a computer. The computer program may be stored on a computer-readable medium and may be executable by a microprocessor.

The program may use any programming language, and it may be in the form of source code, object code, or code intermediate between source code and object code, such as in a partially complied form, or in any other desirable form.

The invention also provides a non-removable or a partially or totally removable data medium that is readable by a computer and that comprises instructions of a computer program as mentioned above. The data medium may be any entity or device capable of storing the program. For example, the medium may comprise storage means such as a read only memory (ROM), e.g. a compact disk (CD) ROM, or a microelectronic circuit ROM, or magnetic recording means, such as a hard disk, or indeed a universal serial bus (USB) flash drive.

Furthermore, the data medium may be a transmissible medium such as an electrical or optical signal, suitable for being conveyed by an electrical or optical cable, by radio, or by other means. The computer program of the invention may in particular be downloadable from an Internet type network.

In a variant, the data medium may be an integrated circuit in which the program is incorporated, the circuit being adapted to execute or to be used in the management of a terminal or an access point of the invention.

Although the present disclosure has been described with reference to one or more examples, workers skilled in the art will recognize that changes may be made in form and detail without departing from the scope of the disclosure and/or the appended claims.

The invention claimed is:

1. An access point comprising:
 a processor; and
 a non-transitory computer-readable data medium comprising instructions of a computer program stored thereon, which when executed by the processor configure the access point to:
  transmit to at least one terminal at least a width of a contention window that said terminal is to observe for transmitting a packet on a channel after expiration of a fixed time interval during which the terminal observes that the channel is free;
  receive data packets transmitted by said terminal in compliance with a multiple access protocol, the multiple access protocol including carrier detection and taking into account said width of the contention window, and wherein said transmitted packets are coded using an erasure code, each coding operation with the erasure code being applied on n successive packets to recover erased packets, wherein n denotes a length of the erasure code; and
  decode the received data packets.

2. The access point according to claim 1, wherein the instructions further configure the access point to transmit to said terminal at least one parameter of said erasure code.

3. The access point according to claim 1, wherein said width of the contention window transmitted by the access point is a function at least of a minimum distance of said erasure code and of a total number of terminals connected to said access point.

4. The access point according to claim 1, wherein the erasure code has a minimum distance d, and enables the access point to correct at least all configurations of erased packets up to (d−1) erased packets.

5. A terminal comprising:
 a processor; and
 a non-transitory computer-readable data medium comprising instructions of a computer program stored thereon, which when executed by the processor configure the terminal to:
  receive, from an access point, at least a width of a contention window that the terminal is to observe for transmitting a packet on a channel after expiration of a fixed time interval during which the terminal observes that the channel is free; and
  transmit data packets to said access point in compliance with a multiple access protocol, the multiple access protocol including carrier detection and taking into account said width of the contention window, and wherein the transmitted packets are coded by an erasure code, each coding operation with the erasure code being applied on n successive packets to recover erased packets, wherein n denotes a length of the erasure code.

6. The terminal according to claim 5, wherein the instructions further configure the terminal to receive from said access point at least one parameter of said erasure code, and taking account thereof.

7. The terminal according to claim 5, wherein the erasure code has a minimum distance d, and enables the access point to correct at least all configurations of erased packets up to (d−1) erased packets.

8. A non-transitory computer-readable data storage medium comprising computer program code instructions stored thereon for managing operation of an access point when the instructions are executed by a processor of the access point, wherein the instructions configure the access point to:
 transmit to at least one terminal at least a width of a contention window that said terminal is to observe for transmitting a packet on a channel after expiration of a fixed time interval during which the terminal observes that the channel is free;
 receive data packets transmitted by said terminal in compliance with a multiple access protocol, the multiple access protocol including carrier detection and taking into account said width of the contention window, and wherein said transmitted packets are coded using an erasure code, each coding operation with the erasure code being applied on n successive packets to recover erased packets, wherein n denotes a length of the erasure code; and
 decode the received data packets.

9. The non-transitory computer-readable data storage medium according to claim 8, wherein the erasure code has a minimum distance d, and enables the access point to correct at least all configurations of erased packets up to (d−1) erased packets.

10. A non-transitory computer-readable data storage medium comprising computer program code instructions stored thereon for managing operation of a terminal when the instructions are executed by a processor of the terminal, wherein the instructions configure the terminal to:

receive, from an access point, at least a width of a contention window that the terminal is to observe for transmitting a packet on a channel after expiration of a fixed time interval during which the terminal observes that the channel is free; and transmit data packets to said access point in compliance with a multiple access protocol, the multiple access protocol including carrier detection and taking into account said width of the contention window, and wherein the transmitted packets are coded by an erasure code, each coding operation with the erasure code being applied on n successive packets to recover erased packets, wherein n denotes a length of the erasure code.

11. The non-transitory computer-readable data storage medium according to claim 10, wherein the erasure code has a minimum distance d, and enables the access point to correct at least all configurations of erased packets up to (d−1) erased packets.

* * * * *

UNITED STATES PATENT AND TRADEMARK OFFICE
CERTIFICATE OF CORRECTION

Page 1 of 1

PATENT NO. : 10,716,145 B2
APPLICATION NO. : 15/542290
DATED : July 14, 2020
INVENTOR(S) : Patrick Tortelier et al.

It is certified that error appears in the above-identified patent and that said Letters Patent is hereby corrected as shown below:

On the Title Page

In Item (72), please delete "moazam" and insert --Moazam--

Signed and Sealed this
Twenty-second Day of February, 2022

Drew Hirshfeld
*Performing the Functions and Duties of the*
*Under Secretary of Commerce for Intellectual Property and*
*Director of the United States Patent and Trademark Office*